United States Patent
Iida et al.

(10) Patent No.: US 7,911,801 B2
(45) Date of Patent: Mar. 22, 2011

(54) MULTILAYER CERAMIC SUBSTRATE AND METHOD FOR MANUFACTURING THE SAME

(75) Inventors: Yuichi Iida, Moriyama (JP); Osamu Chikagawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/691,782

(22) Filed: Jan. 22, 2010

(65) Prior Publication Data

US 2010/0112284 A1    May 6, 2010

Related U.S. Application Data

(63) Continuation of application No. PCT/JP2008/062574, filed on Jul. 11, 2008.

(30) Foreign Application Priority Data

Jul. 26, 2007  (JP) .................. 2007-194329
Dec. 21, 2007  (JP) .................. 2007-329930

(51) Int. Cl.
*H05K 1/18* (2006.01)
*H05K 7/14* (2006.01)

(52) U.S. Cl. ........ 361/761; 361/762; 361/763; 361/764; 174/258; 174/535; 174/541; 428/210; 428/212; 501/16; 501/120

(58) Field of Classification Search .............. 428/210, 428/212; 501/120, 16, 15; 174/250–255, 174/258, 535, 541; 361/761–764
See application file for complete search history.

(56) References Cited

U.S. PATENT DOCUMENTS

| | | | | |
|---|---|---|---|---|
| 5,055,966 | A | * | 10/1991 | Smith et al. ................ 361/321.3 |
| 5,384,434 | A | * | 1/1995 | Mandai et al. ................ 174/258 |
| 5,396,397 | A | * | 3/1995 | McClanahan et al. ........ 361/313 |
| 5,708,570 | A | * | 1/1998 | Polinski, Sr. ................ 361/762 |
| 6,205,032 | B1 | * | 3/2001 | Shepherd ...................... 361/793 |
| 6,395,118 | B1 | * | 5/2002 | Sakamoto et al. .......... 156/89.12 |
| 6,432,239 | B1 | * | 8/2002 | Mandai et al. ............. 156/89.12 |
| 6,455,453 | B1 | * | 9/2002 | Chikagawa ................... 501/120 |
| 6,776,861 | B2 | * | 8/2004 | Wang et al. ................ 156/89.11 |
| 6,797,093 | B2 | * | 9/2004 | Moriya et al. ............. 156/89.12 |
| 6,893,710 | B2 | * | 5/2005 | Lee et al. ....................... 428/210 |

(Continued)

FOREIGN PATENT DOCUMENTS

| | | |
|---|---|---|
| JP | 2002-84067 A | 3/2002 |
| JP | 2004-55728 A | 2/2004 |
| JP | 2005-191316 A | 7/2005 |

(Continued)

OTHER PUBLICATIONS

Official Communication issued in International Patent Application No. PCT/JP2008/062574, mailed on Aug. 12, 2008.

*Primary Examiner* — Cathy Lam

(74) *Attorney, Agent, or Firm* — Keating & Bennett, LLP

(57) ABSTRACT

A laminate includes base material layers and interlayer constraining layers disposed therebetween. The base material layers are formed of a sintered body of a first powder including a glass material and a first ceramic material, and the interlayer constraining layer includes a second powder including a second ceramic material that will not be sintered at a temperature for melting the glass material, and is in such a state that the second powder adheres together by diffusion or flow of a portion of the first powder including the glass material included in the base material layer at the time of baking. The incorporated element is in such a state that an entire periphery thereof is covered with the interlayer constraining layer.

8 Claims, 6 Drawing Sheets

U.S. PATENT DOCUMENTS

| | | | |
|---|---|---|---|
| 7,175,724 B2 * | 2/2007 | Wang et al. | 156/89.11 |
| 7,417,196 B2 * | 8/2008 | Wada et al. | 174/260 |
| 7,722,732 B2 * | 5/2010 | Needes et al. | 156/89.14 |
| 2002/0026978 A1 | 3/2002 | Harada et al. | |

FOREIGN PATENT DOCUMENTS

| | | |
|---|---|---|
| JP | 2007-53328 A | 3/2007 |
| JP | 3928665 B2 | 6/2007 |
| WO | 2006/030562 A1 | 3/2006 |

* cited by examiner

MULTILAYER CERAMIC SUBSTRATE AND METHOD FOR MANUFACTURING THE SAME

BACKGROUND OF THE INVENTION

1. Field of the Invention

The present invention relates to multilayer ceramic substrates and methods for manufacturing the same, and more specifically, to a multilayer ceramic substrate incorporating an element, such as a laminated ceramic capacitor, and to a method for manufacturing the same.

2. Description of the Related Art

Japanese Unexamined Patent Publication No. 2002-84067 discloses a method for manufacturing a multilayer ceramic substrate incorporating a functional element by preliminarily preparing a functional element such as a capacitor element, inductor element, resistance element or the like, from a plate-like sintered body that is obtained by preliminarily baking a ceramic functional material, arranging the functional element inside an unsintered raw laminate which is to become a multilayer ceramic substrate by baking, and baking the raw laminate in this state.

Japanese Unexamined Patent Publication No. 2002-84067 also discloses application of a so-called non-shrink process for manufacturing the multilayer ceramic substrate described above. More specifically, outside constraining layers are arranged so as to sandwich the raw laminate to become a multilayer ceramic substrate in the direction of lamination. The outside constraining layers include ceramic material powder that will not be sintered at a baking temperature. Therefore, in a baking step, the outside constraining layers act to inhibit shrinkage of the laminate, and as a result, act such that non-uniform shrinkage is less likely to occur. The outside constraining layers are then removed after the baking step.

However, when the method described in Japanese Unexamined Patent Publication No. 2002-84067 is practiced, there sometimes arises a problem that cracking occurs in the incorporated functional element. This is caused by relatively large compression stress exerted on the functional element in the baking step for obtaining the multilayer ceramic substrate. In a so-called non-shrink process, while substantially no shrinkage occurs in the direction of a principal surface of the raw laminate at the time of baking, relatively large shrinkage occurs in the direction of thickness, and larger compression stress arises. In particular, an inner layer portion at a deeper position than a superficial portion of the laminate constrained by the outside constraining layers is less likely to receive the effect of the outside constraining layers, and thus is more likely to receive compression stress.

When a functional element is incorporated inside a raw laminate, a green sheet that forms the raw laminate is not usually able to deform to perfectly fit an outer surface of the functional element. Therefore, a gap often arises in the periphery of the functional element. Since such a gap largely shrinks at the time of baking, the stress concentrates in this region. This may result in a trouble that cracking occurs not only in the incorporated element but also in the multilayer ceramic substrate itself.

Japanese Unexamined Patent Publication No. 2002-84067 also discloses a via conductor, as one example of a wiring conductor on the side of the multilayer ceramic substrate which is to be electrically connected with a terminal electrode provided in the incorporated element. However, when a via conductor is directly connected with a terminal electrode of an incorporated element, there sometimes arises a problem in that cracking occurs undesirably in the incorporated element.

This is attributable to the fact that, in the baking step, a shrinkage factor of the material for the via conductor is smaller than that of the ceramic material forming the multilayer ceramic substrate, and the via conductor behaves so as to protrude toward the incorporated element at the time of baking. Probably, when a multilayer ceramic substrate is produced by a non-shrink process using outside constraining layers as described in Japanese Unexamined Patent Publication No. 2002-84067, in particular, the outside constraining layers act to push an end portion of the via conductor, and another end portion of the via conductor protrudes more extensively toward the incorporated element.

When the incorporated element has an electrode containing nickel, more specifically, when the incorporated element is, for example, a laminated ceramic capacitor and nickel is used as its internal electrode material, cracking may occur in a dielectric layer of the incorporated laminated ceramic capacitor starting from the internal electrode, or a terminal electrode of the laminated ceramic capacitor may be peeled off if baking is conducted under a condition suited for baking of the multilayer ceramic substrate.

The above problem is more significant in a case where silver is used in the wiring conductor on the side of the multilayer ceramic substrate. This is because, in using silver in a wiring conductor on the side of a multilayer ceramic substrate, an air atmosphere is generally employed as a furnace atmosphere at the time of baking. More specifically, when a raw laminate that is intended to become a multilayer ceramic substrate is baked in an air atmosphere, nickel contained in the internal electrode of the incorporated laminated ceramic capacitor is oxidized to generate NiO, and the volume of the internal electrode expands. This may cause cracking in the dielectric layer of the laminated ceramic capacitor or peeling of the terminal electrode of the laminated ceramic capacitor.

SUMMARY OF THE INVENTION

Accordingly, preferred embodiments of the present invention provide a multilayer ceramic substrate and a method for manufacturing the same, which solve the problems described above.

According to a preferred embodiment of the present invention, a multilayer ceramic substrate includes a laminate including a plurality of laminated base material layers and an interlayer constraining layer disposed between specific ones of the base material layers, an incorporated element disposed in a position sandwiched between the specific base material layers, and an internal conductive film electrically connected with the incorporated element and arranged inside the laminate so as to extend in a direction of extension of the base material layers.

The base material layers are preferably formed of a sintered body including a first powder including a glass material and a first ceramic material, the interlayer constraining layer includes a second powder including a second ceramic material not sintered at a temperature for melting the glass material, and is in a state where the second powder adheres together due to diffusion or flow of a portion of the first powder including the glass material included in the base material layers into the interlayer constraining layer upon baking.

It is preferred that the constraining layer includes an interlayer constraining layer provided between the base material layers sandwiching the incorporated element to cover at least an entire periphery of the incorporated element.

In a case where the incorporated element includes an element main body and a terminal electrode provided on an outer surface of the element main body, the internal conductive film preferably includes a portion extending to cover a boundary between the element main body and the terminal electrode.

The internal conductive film preferably includes a portion arranged to sandwich the incorporated element in a direction of lamination.

In a case of further including a via conductor to be electrically connected with the incorporated element inside the laminate, the via conductor is preferably arranged so as to be connected with a portion of the internal conductive film drawn out to a lateral side of the incorporated element, the internal conductive film is electrically connected with the incorporated element.

The interlayer constraining layer provided between the base material layers sandwiching the incorporated element may be arranged over an entire area in a direction of a principal plane of the laminate, or may be provided only near the incorporated element.

Preferably, the interlayer constraining layer preferably includes an interlayer constraining layer other than that provided between the base material layers sandwiching the incorporated element.

According to another preferred embodiment of the present invention, a method for manufacturing the multilayer ceramic substrate described above includes the steps of preparing green sheets for defining base material layers including a first powder including a glass material or a glass component capable of melting into glass by baking to become a glass material, and a first ceramic material, green sheets for defining constraining layers including a second powder including a second ceramic material not sintered at a temperature for melting the glass material, and an incorporated element.

Subsequently performed is the step of fabricating a raw laminate in which two of the green sheets for defining constraining layers positioned to sandwich the incorporated element are integrated on a lateral side of the incorporated element by laminating and crimping the green sheet for defining a base material layer, the green sheet for defining a constraining layer, and the incorporated element in an order of the green sheet for defining a base material layer, the green sheet for defining a constraining layer, the incorporated element, the green sheet for defining a constraining layer and the green sheet for defining a base material layer.

Conducted next is the step of baking the raw laminate at a predetermined temperature so that at least portion of the first powder is sintered and the second powder adheres together substantially without being sintered, by allowing a portion of the first powder including the glass material to diffuse or flow into the green sheet for defining a constraining layer.

In a case where the incorporated element includes an element main body and a terminal electrode formed on an outer surface of the element main body, the step of fabricating a raw laminate preferably includes the step of forming an unbaked internal conductive film so as to cover a boundary between the element main body and the terminal electrode.

In the method for manufacturing the multilayer ceramic substrate according to a preferred embodiment of the present invention, preferably, the step of fabricating a raw laminate includes the step of forming a first and a second unbaked internal conductive films respectively facing each other on principal planes of the two green sheets for defining a constraining layer positioned to sandwich the incorporated element, and in the fabricated raw laminate, the first and second unbaked internal conductive films are integrated on a lateral side of the incorporated element.

Preferably conducted upon fabricating a raw laminate are the steps of: fabricating a first composite green sheet in which a first one of the green sheets for defining a constraining layer is stacked on a first one of the green sheets for defining a base material layer; arranging the incorporated element on the first green sheet for defining a constraining layer; fabricating a second composite green sheet in which a second one of the green sheets for defining a constraining layer is stacked on a second one of the green sheets for defining a base material layer; and laminating the first composite green sheet and the second composite green sheet so that the second green sheets for defining constraining layers come into contact with the incorporated element.

In fabricating the raw laminate, it is preferred to overlay at least one of principal planes of the raw laminate with an outside constraining layer in a raw state including a third powder including a third ceramic material that is not sintered at a temperature for melting a glass material included in the green sheet for a base material layer. In this case, the outside constraining layer is removed after the baking step.

When the incorporated element includes an electrode including nickel, it is preferable to conduct the baking step in an atmosphere where oxygen concentration in a temperature region exceeding about 700° C. is less than about 100 ppm, for example.

According to various preferred embodiments of the present invention, since the entire periphery of the incorporated element is covered with the interlayer constraining layer, the compression stress exerted on the incorporated element in the baking step is advantageously alleviated by the interlayer constraining layer, and hence it is possible to effectively prevent the occurrence of cracking in the incorporated element. Moreover, since shrinkage in the gap portion that can be generated in the periphery of the incorporated element is prevented by the interlayer constraining layer, it is possible to prevent the occurrence of cracking also on the side of the laminate.

When the incorporated element includes an element main body and a terminal electrode provided on an outer surface of the element main body, an internal conductive film that includes a portion extending to cover the boundary between the element main body and the terminal electrode is able to alleviate the stress that is likely to concentrate on the boundary between the element main body and the terminal electrode, and thus cracking can be prevented from occurring in the incorporated element.

When the internal conductive film includes a portion arranged to sandwich the incorporated element in the direction of lamination, cracking in the incorporated element and the laminate described above can be prevented more reliably.

In various preferred embodiments of the present invention, in a case where a via conductor is provided, the problem of occurrence of cracking due to protrusion of the via conductor at the time of baking can be avoided if the via conductor is arranged so as to be connected to a portion of the internal conductive film drawn out to a lateral side of the incorporated element, wherein the internal conductive film is electrically connected with the incorporated element.

When the interlayer constraining layer provided between the base material layers sandwiching the incorporated element is arranged over the entire area in the direction of the principal plane of the laminate, shrinkage in the direction of the principal plane of the entire laminate can be prevented more effectively by this interlayer constraining layer.

On the other hand, when the interlayer constraining layer provided between the base material layers sandwiching the incorporated element is provided only near the incorporated element, it is possible to obtain a more reliable junction condition between the base material layers sandwiching the incorporated element.

When an interlayer constraining layer other than that provided between the base material layers sandwiching the incorporated element is provided as an interlayer constraining layer, it is possible to inhibit shrinkage of the laminate more perfectly at the time of baking.

In the method for manufacturing a multilayer ceramic substrate according to a preferred embodiment of the present invention, when the raw laminate is overlaid with the outside constraining layer, a more perfect shrinkage inhibiting effect is exerted at the time of baking, and dimensional accuracy of the obtained multilayer ceramic substrate can be further improved.

When the incorporated element includes an electrode including nickel, oxidative expansion of the nickel included in the electrode of the incorporated element can be prevented in the baking step conducted in an atmosphere where oxygen concentration in the temperature region exceeding about 700° C. is less than about 100 ppm, for example, and thus cracking in the incorporated element or peeling of the terminal electrode of the incorporated element can be reliably prevented.

Other elements, features, steps, characteristics and advantages of the present invention will become more apparent from the following detailed description of the preferred embodiments with reference to the attached drawings.

BRIEF DESCRIPTION OF THE DRAWINGS

FIGS. 4-1 and 4-2 are charts sequentially showing steps executed for fabricating the raw laminate 6a shown in FIG. 3, representing a portion corresponding to the portion shown in FIG. 2.

DETAILED DESCRIPTION OF THE PREFERRED EMBODIMENTS

Figure 1:
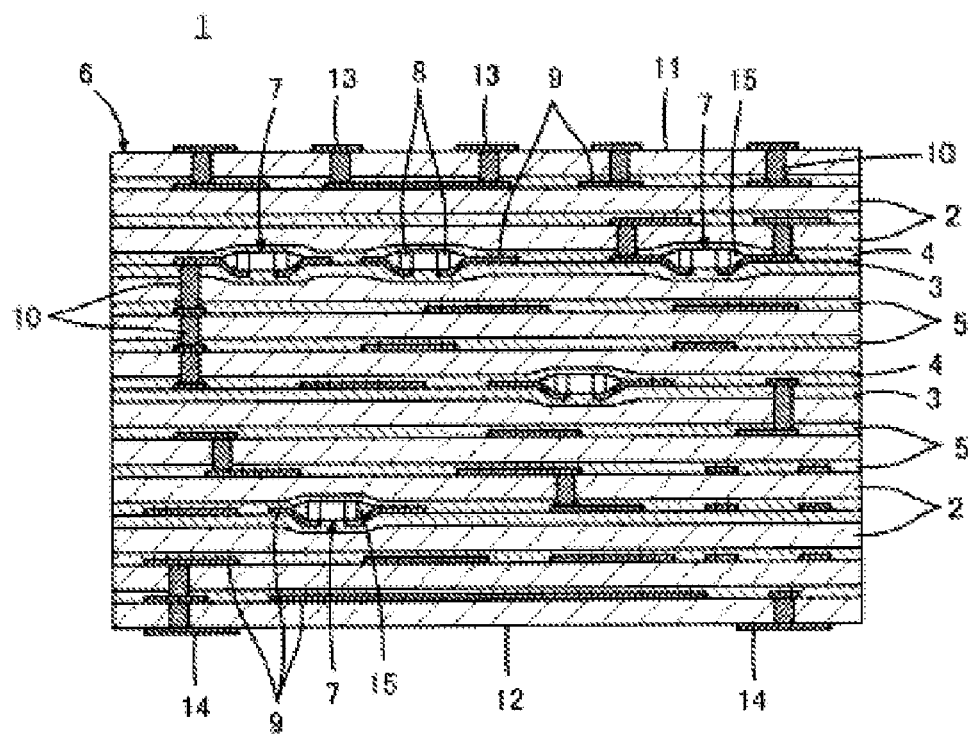
FIG. 1 is a cross section view schematically showing a multilayer ceramic substrate 1 according to a first preferred embodiment of the present invention.
Figure 2:
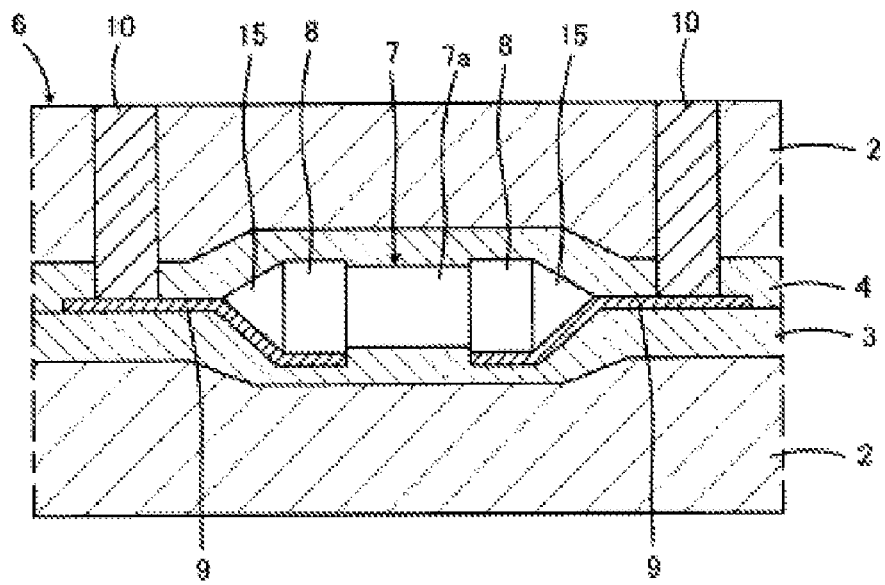
FIG. 2 is a cross section view showing in close-up a portion of the multilayer ceramic substrate 1 in FIG. 1.

FIG. 1 to FIG. 4-2 are views for illustrating a first preferred embodiment of the present invention. FIG. 1 is a cross section view schematically showing a multilayer ceramic substrate 1 according to the first preferred embodiment. FIG. 2 is a cross section view showing a portion of FIG. 1 in close-up. FIG. 3 and FIGS. 4-1 and 4-2 are views for illustrating a method for manufacturing the multilayer ceramic substrate 1 shown in FIG. 1.

Referring to FIG. 1, the multilayer ceramic substrate 1 includes a laminate 6 including a laminated plurality of base material layers 2 and interlayer constraining layers 3 to 5 each disposed between specific ones of the base material layers 2. In this preferred embodiment, the interlayer constraining layers 3 and 4 are arranged so as to contact each other, and between any of the adjacent base material layers 2, the interlayer constraining layers 3 and 4 or the interlayer constraining layer 5 are/is disposed. Each of the interlayer constraining layers 3 to 5 preferably is thinner than the base material layers 2.

The multilayer ceramic substrate 1 includes several incorporated elements 7. Each of the incorporated elements 7 is typically a chip-type laminated ceramic electronic component such as a laminated ceramic capacitor, however it may be a capacitor element other than the above, an inductor element, resistance element, or the like. As is well depicted in FIG. 2, the incorporated element 7 includes an element main body 7a and a terminal electrode 8 provided on an outer surface of each end portion of the element main body 7a.

The multilayer ceramic substrate 1 also includes internal conductive films 9 arranged to extend in the direction of extension of the base material layers 2 inside the laminate 6. As is well depicted in FIG. 2, each of the internal conductive films 9 includes a portion that is electrically connected with the terminal electrode 8 of the incorporated element 7.

The multilayer ceramic substrate 1 also includes via conductors 10 each arranged to penetrate the base material layer 2 and specific one(s) of the interlayer constraining layers 3 to 5 in the direction of thickness, and external conductive films 13 and 14 respectively provided on first and second principal planes 11 and 12 of the laminate 6. Each of the via conductors 10 is electrically connected with a specific one of the internal conductive film 9 and also electrically connected with the external conductive film 13 or 14.

Although not depicted, on the one principal plane 11 of the laminate 6, several surface mount components are mounted. The external conductive film 13 is used for electrically connecting these surface mount components. On the other hand, the external conductive film 14 provided on the other principal plane 12 of the laminate 6 is preferably used for electrically connecting the multilayer ceramic substrate 1 to a mother board (not depicted) when the multilayer ceramic substrate 1 is mounted on the mother board.

As is apparent from the later-described description of the manufacturing method, the base material layer 2 is formed of a sintered body of first powder including a glass material and a first ceramic material. On the other hand, the interlayer constraining layers 3 to 5 each include a second powder including a second ceramic material that will not be sintered at a temperature for melting the glass material, and are in such a condition that the second powder adheres together as a result of diffusion or flow of a portion of the first powder including the glass material included in the base material layer 2 into the interlayer constraining layers 3 to 5 at the time of baking.

One of the novel aspects of the present preferred embodiment is that the interlayer constraining layers 3 and 4 provided between the base material layers 2 sandwiching the incorporated element 7 are arranged so as to cover the entire periphery of the incorporated element 7. That is, as is well depicted in FIG. 2, the two interlayer constraining layers 3 and 4 disposed to sandwich the incorporated element 7 are integrated to each other in the lateral side of the incorporated element 7 while forming a gap 15 in the periphery of the incorporated element 7. While the gap 15 is formed in the periphery of each of the incorporated elements 7 in FIG. 1, the gap 15 may not be formed in a portion or all of the incorporated elements 7.

As is well depicted in FIG. 2, the via conductor 10 to be electrically connected with the incorporated element 7 is arranged in such a manner that it is connected to a portion, drawn out to the lateral side of the incorporated element 7, of the internal conductive film 9 electrically connected with the terminal electrode 8 of the incorporated element 7, rather than it is directly connected with the terminal electrode 8 of the incorporated element 7.

Figure 3:
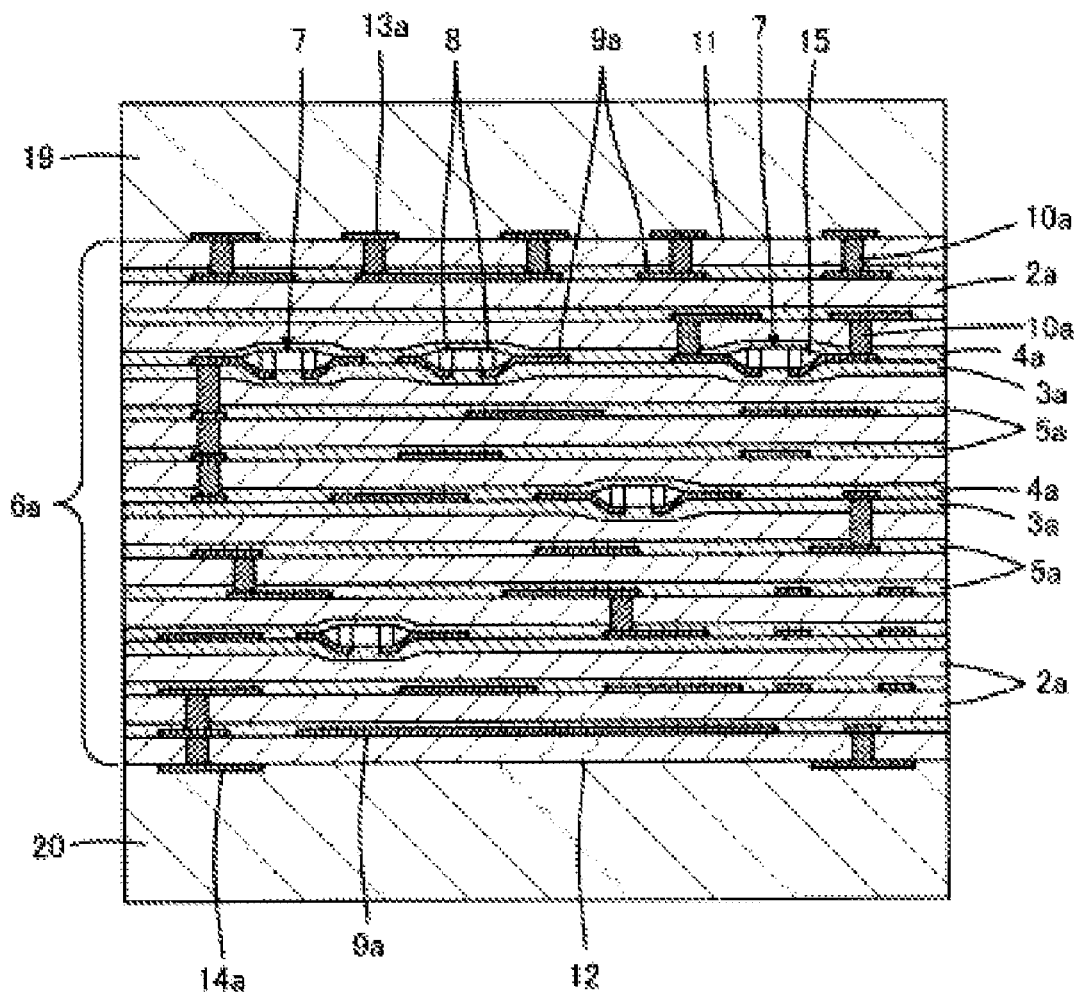
FIG. 3 is a cross section view schematically showing a raw laminate 6a fabricated for manufacturing the multilayer ceramic substrate 1 shown in FIG. 1.
Figures 1, 4:
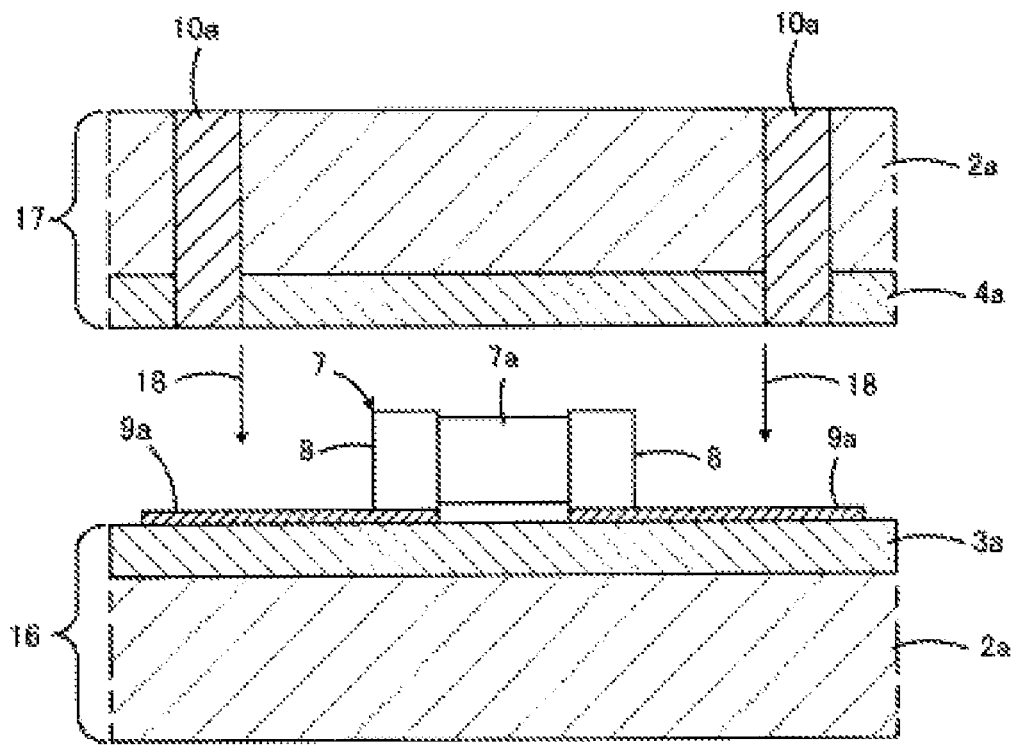
Figures 2, 4:
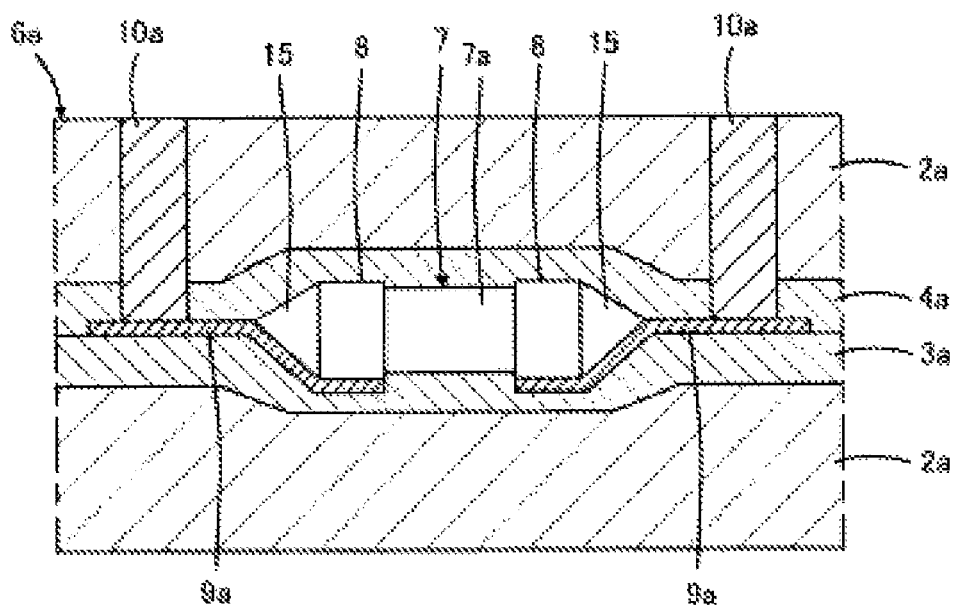

The multilayer ceramic substrate 1 is obtained by baking a raw laminate 6a shown in FIG. 3, and the raw laminate 6a is fabricated through the steps as shown in FIGS. 4-1 and 4-2.

As shown in FIG. 3, the raw laminate 6a includes elements corresponding to the elements included in the laminate 6 after sintering as shown in FIG. 1. More specifically, the raw laminate 6a includes green sheets for defining base material layers 2a which are to become the base material layers 2, green sheets for defining constraining layers 3a to 5a which are to become the interlayer constraining layers 3 to 5, unbaked internal conductive films 9a which are to become the internal conductive films 9, unbaked via conductors 10a which are to become the via conductors 10, and unbaked external conductive films 13a and 14a which are to become the external conductive films 13 and 14. The raw laminate 6a also includes the incorporated elements 7 obtained after completion of the baking step.

The green sheet for defining base material layer 3a includes a first powder including a glass material or a glass component capable of melting into glass by baking to become a glass material as well as a first ceramic material. On the other hand, the green sheets for defining constraining layers 3a to 5a include a second powder including a second ceramic material that will not be sintered at a temperature for melting the glass material. Unless otherwise requested, the green sheets for defining constraining layers 3a to 5a preferably have the same composition and the same thickness. The green sheets for defining constraining layers 3a to 5a may each include a glass material or a glass component capable of melting into glass by baking to become a glass material as long as the constraining power thereof is not influenced.

For example, as the glass material included in the green sheet for defining base material layer 2a, borosilicate-based glass is preferably used, and alumina is preferably used as the first ceramic material. As the second ceramic material included in the green sheets for defining constraining layers 3a to 5a, any one of alumina, magnesium oxide, zirconium oxide, silicon oxide, and titanium oxide may preferably be used.

As one example, the green sheet for defining base material layer 2a is obtained by preparing a slurry by mixing about 60 parts by weight of borosilicate-based glass powder having an average particle size of about 4 µm, about 40 parts by weight of alumina powder having an average particle size of about 0.35 µm, about 50 parts by weight of water serving as a dispersing medium, about 20 parts by weight of polyvinyl alcohol serving as a binder, and about 1 part by weight of polycarbonate-based dispersing agent serving as a dispersing agent, removing air bubbles from the slurry, forming the slurry into a sheet form by a doctor blade method, and drying the same. Thickness of the green sheet for defining base material layer 2a is, for example, about 20 µm to about 200 µm.

On the other hand, the green sheets for defining constraining layers 3a to 5a are each obtained, for example, by preparing a slurry by mixing about 100 parts by weight of alumina powder having an average particle size of about 0.4 µm, about 50 parts by weight of water serving as a dispersing medium, about 20 parts by weight of polyvinyl alcohol serving as a binder, and about 1 part by weight of a polycarbonate-based dispersing agent serving as a dispersing agent, removing air bubbles from the slurry, forming the slurry into a sheet form by the doctor blade method, and drying the same. Thickness of each of the green sheets for defining constraining layers 3a to 5a is, for example, about 1 µm to about 10 µm.

Also the unbaked internal conductive film 9a, the unbaked via conductor 10a and the unbaked external conductive films 13a and 14a are provided by a conductive paste including, for example, silver as a conductive component. There may be used the conducive paste such as one including about 48 parts by weight of silver powder having an average particle size of about 2 µm, about 3 parts by weight of ethyl cellulose serving as a binder, and about 49 parts by weight of terpenes serving as a solvent, for example.

For fabricating the raw laminate 6a, the aforementioned green sheets for defining base material layer 2a, the green sheets for defining constraining layers 3a to 5a, the incorporated elements 7 and the conductive paste are prepared.

Using these green sheets for defining base material layer 2a, the green sheets for defining constraining layers 3a to 5a, the incorporated element 7 and the conductive paste, the raw laminate 6a is fabricated. A process of fabricating the raw laminate 6a includes a step of laminating the green sheets for defining base material layer 2a, the green sheets for defining constraining layers 3a and 4a and the incorporated elements 7 together and crimping together in an order of the green sheet for defining base material layer 2a, the green sheet for defining constraining layer 3a, the incorporated element 7, the green sheet for defining constraining layer 4a, and the green sheet for defining base material layer 2a as is appearing in a portion of the raw laminate 6a shown in FIG. 3. By practicing this step, the raw laminate 6a is obtained in such a condition that the two green sheets for defining constraining layers 3a and 4a arranged to sandwich the incorporated element 7 are integrated with each other in the lateral side of the incorporated element 7.

More specifically, as shown in FIG. 4-1, executed are a step of fabricating a first composite green sheet 16 in which the first green sheet for defining constraining layer 3a is stacked on the first green sheet for defining base material layer 2a, and a step of fabricating a second composite green sheet 17 in which the second green sheet for defining constraining layer 4a is stacked on the second green sheet for defining base material layer 2a.

For obtaining the aforementioned composite green sheets 16 and 17, the green sheet for defining base material layer 2a and the green sheet for defining constraining layers 3a or 4a formed separately from each other may be stacked, or alternatively, the green sheet for defining constraining layer 3a or 4a may be directly formed on one principal plane of the green sheet for defining base material layer 2a.

On one principal plane of the first composite green sheet 16, namely, on the principal plane facing outward of the first green sheet for defining constraining layer 3a, the unbaked internal conductive film 9a is preferably formed as necessary. On the other hand, the second composite green sheet 17 is preferably formed with the unbaked via conductor 10a as necessary.

Next, similarly as shown in FIG. 4-1, the incorporated element 7 is arranged on the first green sheet for defining constraining layer 3a. More specifically, the incorporated element 7 is arranged so that the terminal electrode 8 is placed on the unbaked internal conductive film 9a. As shown by arrows 18, the first composite green sheet 16 and the second composite green sheet 17 are brought close to each other and crimped to each other so that the second green sheet for defining constraining layer 4a comes into contact with the incorporated element 7.

As a result, as shown in FIG. 4-2, the state is obtained in which the first composite green sheet 16 and the second composite green sheet 17 are stacked together. In this state, the first green sheet for defining constraining layer 3a and the second green sheet for defining constraining layer 4a are integrated with each other via the unbaked internal conductive film 9a being sandwiched on the lateral side of the incorporated element 7, while leaving the gap 15 in the periphery of the internal element 7. The unbaked via conductor 10a is connected to a portion, which is drawn out to the lateral side of the incorporated element 7, of the unbaked internal conductive film 9a that is electrically connected with the incorporated element 7.

In the above process, the stacking process of the green sheets in a specific portion of the raw laminate 6a shown in FIGS. 4-1 and 4-2 was described in detail, however, in this stacking process, stacking of the green sheets in other portions of the raw laminate 6a is simultaneously executed.

In the step of fabricating the raw laminate 6a, as shown in FIG. 3, there is executed a step of overlaying at least one of the principal planes, preferably both of the principal planes, of the raw laminate 6a with the outside constraining layers 19 and 20 in raw states. The outside constraining layers 19 and 20 each have a composition including third powder including a third ceramic material that will not be sintered at a temperature for melting the glass material included in the green sheet for defining base material layer 2a. Usually, the outside constraining layers 19 and 20 each have the same composition as that of the green sheets for defining constraining layers 3a to 5a.

Next, the raw laminate 6a formed with the outside constraining layers 19 and 20 as described above is baked. The temperature condition in this baking is selected so that the following phenomena are achieved: the second powder included in each of the green sheets for defining constraining layers 3a to 5a adheres to each other substantially without being sintered, by sintering at least a portion of the first powder included in the green sheet for defining base material layer 2a and allowing a portion of the first powder including the glass material to diffuse or flow into the green sheets for defining constraining layer 3a to 5a.

Also in the outside constraining layers 19 and 20, the third powder is not substantially sintered. Therefore, the outside constraining layers 19 and 20 are removed after the baking step. On the other hand, the green sheets for defining constraining layers 3a to 5a become the interlayer constraining layers 3 to 5 wherein the second powder adheres to each other, and remain in the laminate 6 after sintering.

In the baking step described above, the interlayer constraining layers 3 to 5 and the outside constraining layers 19 and 20 exert a shrinkage inhibiting effect on the base material layer 2 with which each of the layers is in contact, and inhibit undesired deformations and the like from occurring in the obtained laminate 6. As a result, it is possible to improve the dimensional accuracy of the laminate 6.

Focusing on the portion where the incorporated element 7 is provided, since the entire periphery of the incorporated element 7 is covered with the interlayer constraining layers 3 and 4, the compressive stress exerted on the incorporated element in the baking step is advantageously alleviated by the interlayer constraining layers 3 and 4, with the result that the occurrence of cracking in the incorporated element 7 can be inhibited. Since shrinkage in the portion of the gap 15 occurring in the periphery of the incorporated element 7 is inhibited by the interlayer constraining layers 3 and 4, it is possible to inhibit the occurrence of cracking also on the side of the laminate 6.

Since the via conductor 10 is arranged so as to be connected with the internal conductive film 9 in the portion drawn out to the lateral side of the incorporated element 7, a disadvantage of causing cracking due to protrusion of the via conductor 10 during baking can be avoided.

The above-described baking step is preferably conducted in an atmosphere where oxygen concentration in a temperature region exceeding about 700° C. is less than about 100 ppm, for example, when the incorporated element 7 uses nickel as an electrode material. In order to confirm the above, the following experiments were conducted.

The raw laminate 6a formed with the outside constraining layers 19 and 20 as shown in FIG. 3 was fabricated. In this case, as the incorporated element 7, a laminated ceramic capacitor was used.

Next, in the baking step, the raw laminate 6a was baked in a baking furnace in which a furnace oxygen concentration in a temperature region exceeding about 700° C. was set to approximate values of 35 ppm, 100 ppm, 300 ppm, or 1000 ppm as shown in Table 1, or in a baking furnace of an ambient atmosphere (oxygen concentration: about 20%), to obtain the sintered laminate 6.

Next, the laminate 6 after sintering was washed, and the outside constraining layers 19 and 20 were removed by a blast treatment.

Next, the cross section of the portion where the incorporated element 7 is situated in the laminate 6 was observed, and the rate of occurrence of cracking in the incorporated element 7 was evaluated, and whether or not NiO is detected in the internal electrode portion of the incorporated element 7 was checked by WDX detection. Evaluation results of these rates of crack occurrence and NiO detection are shown in Table 1.

TABLE 1

| Sample No. | Oxygen concentration | Rate of crack occurrence (number of elements in which cracking occurs/total number of elements) | Whether or not NiO detected |
|---|---|---|---|
| 1 | Air | 100% (10/10) | Detected |
| 2 | 1000 ppm | 100% (10/10) | Detected |
| 3 | 300 ppm | 30% (3/10) | Detected |
| 4 | 100 ppm | 10% (1/10) | Detected |
| 5 | 35 ppm | 0% (0/10) | Detection limit or lower |

As is apparent from Table 1, cracking was observed in every incorporated element in Sample 1 baked in an ambient atmosphere, whereas the rate of crack occurrence is reduced as the oxygen concentration in the furnace atmosphere at the time of baking decreases as in Samples 2 to 5, and crack occurrence was completely prevented by setting the furnace oxygen concentration at about 35 ppm. As for detection of NiO in the internal electrode portion, NiO was detected in the condition of the oxygen concentration of about 100 ppm or higher as in Samples 1 to 4, however, NiO was not detected in the condition of the oxygen concentration of about 35 ppm.

The problem of nickel containment as described above may arise not only when nickel is contained in the internal electrode of the incorporated element but also when nickel is contained in a terminal electrode (external electrode) of the incorporated element.

Figure 5:
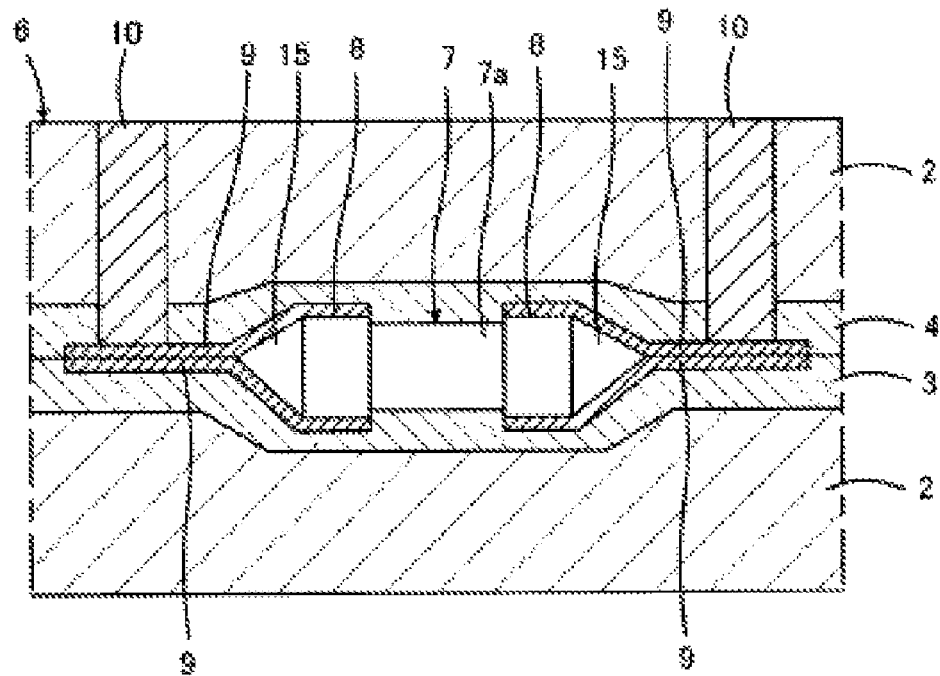
FIG. 5 is a view corresponding to FIG. 2, for illustrating a second preferred embodiment of the present invention.
Figure 6:
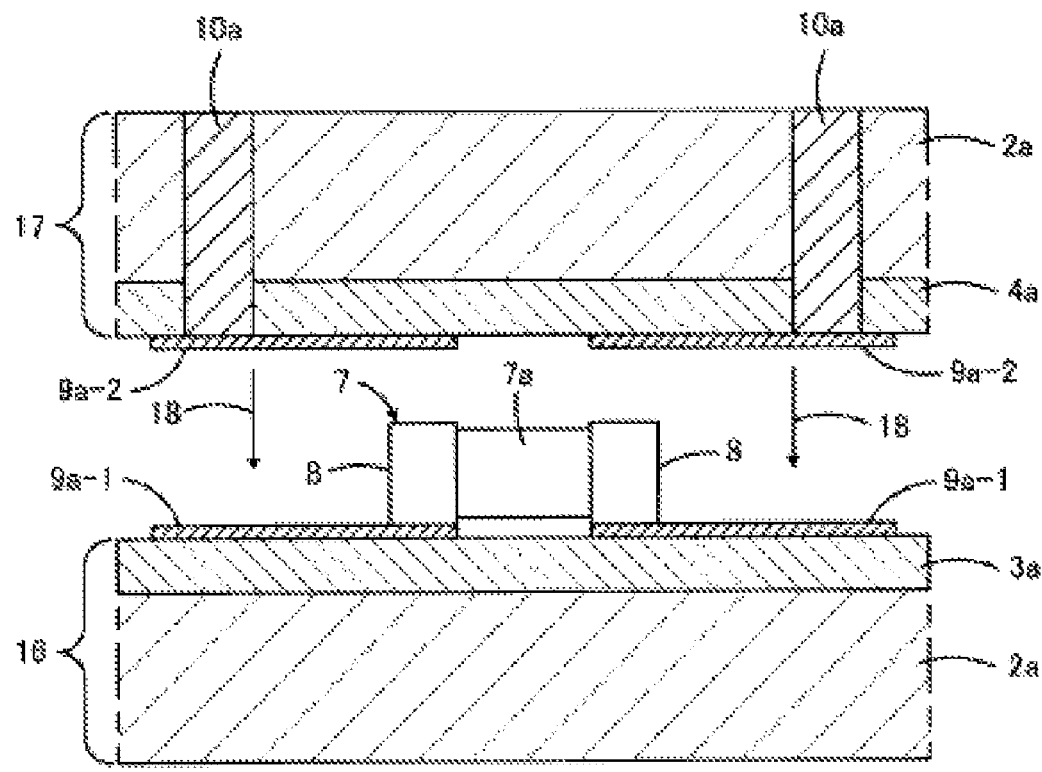
FIG. 6 is a view corresponding to FIG. 4-1, for illustrating steps executed for fabricating a laminate shown in FIG. 5.

FIGS. 5 and 6 are views corresponding to FIG. 2 and FIG. 4-1, respectively, for explaining a second preferred embodiment of the present invention. In FIG. 5 and FIG. 6, a portion corresponding to a portion shown in FIG. 2 or FIG. 4-1 is denoted by a similar reference symbol, and duplicative description will not be repeated.

As shown in FIG. 5, one of the unique characteristics of the second preferred embodiment is that the internal conductive films 9 include portions arranged to sandwich the incorporated element 7 in the direction of lamination. For obtaining the internal conductive films 9 in such a state, in the step of fabricating the raw laminate 6a (see FIG. 3), first and second unbaked internal conductive films 9a-1 and 9a-2 are respectively formed on principal planes facing each other of the first and the second green sheets for defining constraining layer 3a and 4a positioned to sandwich the incorporated element 7 as shown in FIG. 6.

In the raw laminate 6a obtained after completion of the stacking step of the green sheets, the first and the second unbaked internal conductive films 9a-1 and 9a-2 as described above are integrated on the lateral sides of the incorporated element 7. The state of integration of these first and second unbaked internal conductive films 9a-1 and 9a-2 can be easily presumed from the state of the internal conductive films 9 after sintering shown in FIG. 5.

As is the case with the second preferred embodiment, when the internal conductive films 9 include the portions arranged to sandwich the incorporated element 7 in the direction of lamination, it is possible to inhibit cracking in the incorporated element 7 and cracking in the laminate 6 more reliably.

Figure 7:
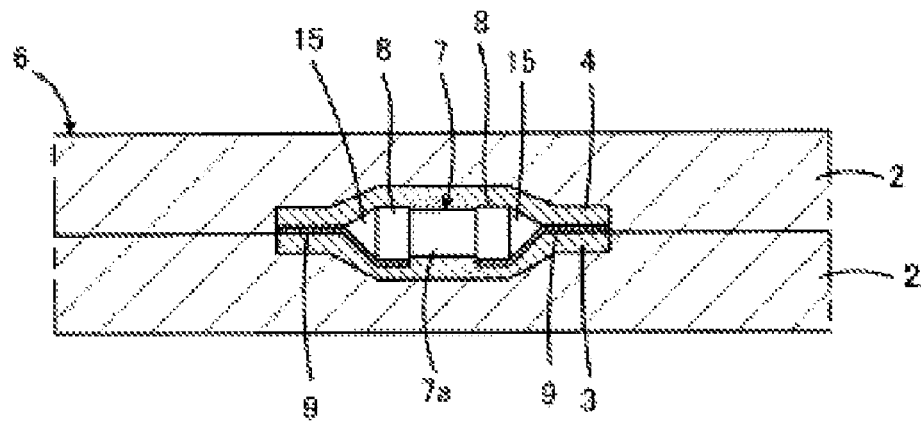
FIG. 7 is a cross section view schematically showing a portion of a laminate 6 provided in a multilayer ceramic substrate according to a third preferred embodiment of the present invention.

FIG. 7 is a cross section view of a portion where the incorporated element 7 is arranged in the laminate 6 for explaining a third preferred embodiment of the present invention. In FIG. 7, a portion corresponding to the portion shown in FIG. 1 or 2 is denoted by a similar reference symbol, and duplicative description will not be repeated.

While the interlayer constraining layers 3 and 4 that are provided between the base material layers 2 sandwiching the incorporated element 7 are preferably arranged over the entire area in the direction of the principal plane of the laminate 6 in the above-described first preferred embodiment, the third preferred embodiment, they are provided only near the incorporated element 7.

When the interlayer constraining layers 3 and 4 provided between the base material layers 2 sandwiching the incorporated element 7 are arranged over the entire area in the direction of the principal plane of the laminate 6 as is the case with the first preferred embodiment, shrinkage in the direction of the principal plane of the entire laminate 6 can be inhibited more effectively by the interlayer constraining layers 3 and 4. However, in the third preferred embodiment, such a shrinkage inhibiting effect is reduced.

Nevertheless, the configuration of covering the entire periphery of the incorporated element 7 with the interlayer constraining layers 3 and 4 is achievable also in the third preferred embodiment. Therefore, even in the third preferred embodiment, cracking in the incorporated element 7 and cracking in the laminate 6 can be inhibited. Further, according to the third preferred embodiment, since the two base material layers 2 sandwiching the incorporated element 7 contact each other over a relatively large area, a more reliable junction state can be obtained between these base material layers 2.

Figure 8:
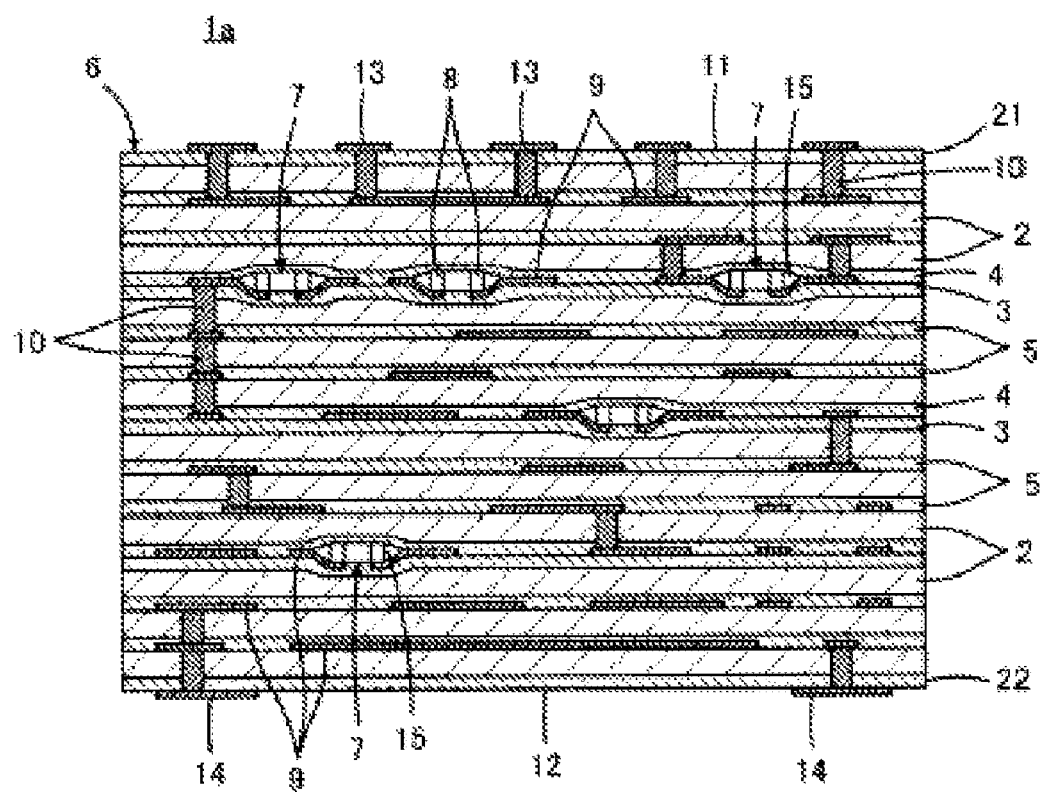
FIG. 8 is a cross section view schematically showing a multilayer ceramic substrate 1a according to a fourth preferred embodiment of the present invention.

FIG. 8 shows a view corresponding to FIG. 1, showing the multilayer ceramic substrate 1a according to a fourth preferred embodiment of the present invention. In FIG. 8, an element corresponding to an element shown in FIG. 1 is denoted by a similar reference symbol, and duplicative description will not be repeated.

The preferred embodiment shown in FIG. 8 is advantageously applied to a case where the outside constraining layers 19 and 20 shown in FIG. 3 are not provided in the baking step. In the multilayer ceramic substrate 1a shown in FIG. 8, the surface constraining layers 21 and 22 are arranged respectively along the principal planes 11 and 12 of the laminate 6.

The surface constraining layers 21 and 22 are preferably formed of a material homogenous to that of the interlayer constraining layers 3 to 5, and the powder included in the surface constraining layers 21 and 22 adhere to each other substantially without being sintered by diffusion or flow of a portion of the first powder included in the green sheets for defining base material layer 2a (see FIG. 3) as a result of the baking step. Therefore, the surface constraining layers 21 and 22 will not be removed after baking, but remain as part of the laminate 6 provided in the multilayer ceramic substrate 1a. With these surface constraining layers 21 and 22, it is possible to further improve the dimensional accuracy of the multilayer ceramic substrate 1a.

Individual thicknesses of the surface constraining layers 21 and 22 may be equal to individual thicknesses of the interlayer constraining layers 3 to 5, however, they are preferably smaller such that a portion of the first powder included in the green sheets for the base material layer 2a can diffuse or flow more reliably over the entire area in the direction of the thicknesses of the surface constraining layers 21 and 22.

Figure 9:
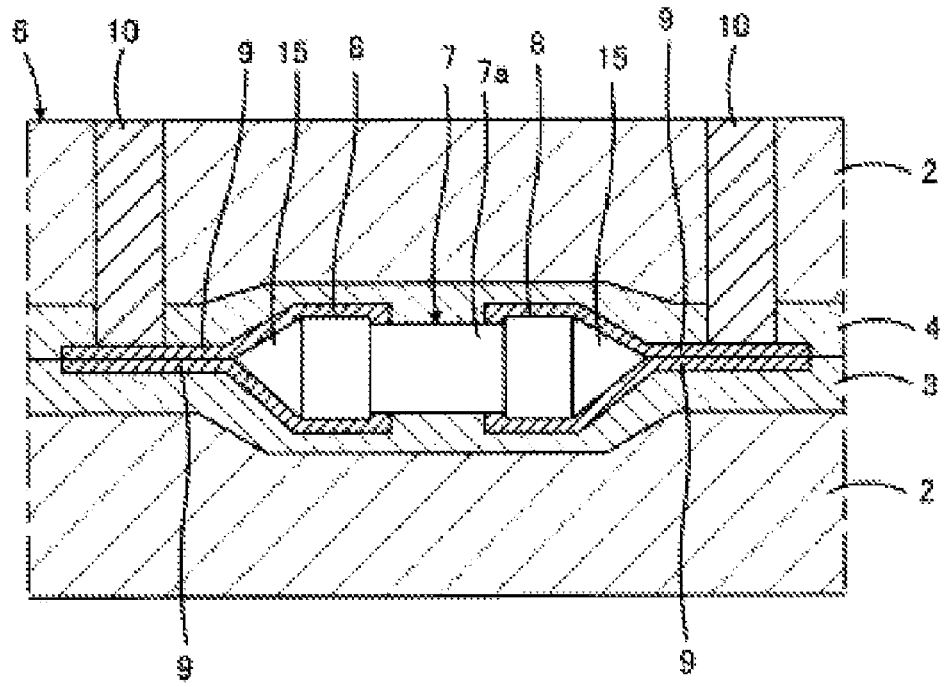
FIG. 9 is a view corresponding to FIG. 2, for illustrating a fifth preferred embodiment of the present invention.

FIG. 9 is a view corresponding to FIG. 2, for explaining a fifth preferred embodiment of the present invention. In FIG. 9, a portion corresponding to a portion shown in FIG. 2 is denoted by a similar reference symbol, and duplicative description will not be repeated.

As shown in FIG. 9, in the fifth preferred embodiment, as in the case of the second preferred embodiment, the internal conductive films 9 include portions arranged to sandwich the incorporated element 7 in the direction of lamination. Further, one of the unique characteristics of the fifth preferred embodiment is that the internal conductive films 9 each include a portion extending to cover the boundary between the element main body 7a of the incorporated element 7 and the terminal electrode 8.

For obtaining the internal conductive film 9 in such a state, the unbaked internal conductive film 9a (see FIG. 6) is formed in such a manner as to cover the boundary between the element main body 7a and the terminal electrode 8 in the step of fabricating the raw laminate 6a (see FIG. 3).

In manufacturing the incorporated element 7, when the terminal electrode 8 is formed on the outer surface of the element main body 7a, for example, by baking a conductive paste, stress is likely to remain in the boundary between the element main body 7a and the terminal electrode 8 in the course of transitioning from baking to cooling. When the laminate 6 is obtained with the incorporated element 7 being disposed therein, the incorporated element 7 receives stress also from the laminate 6 due to difference in coefficient of thermal expansion. Such stress can also be a cause of cracking in the incorporated element 7. When the incorporated element 7 is a ceramic electronic component and the element main body 7a is formed of ceramic, in particular, cracking as described above is more likely to occur.

When the internal conductive films 9 are formed to cover the boundary between the element main body 7a and the terminal electrode 8 as in the fifth preferred embodiment, the stress which is prone to concentrate in the boundary between the element main body 7a and the terminal electrode 8 can be advantageously alleviated by the internal conductive films 9, so that cracking that may occur in the incorporated element 7 can be inhibited.

Figure 10:
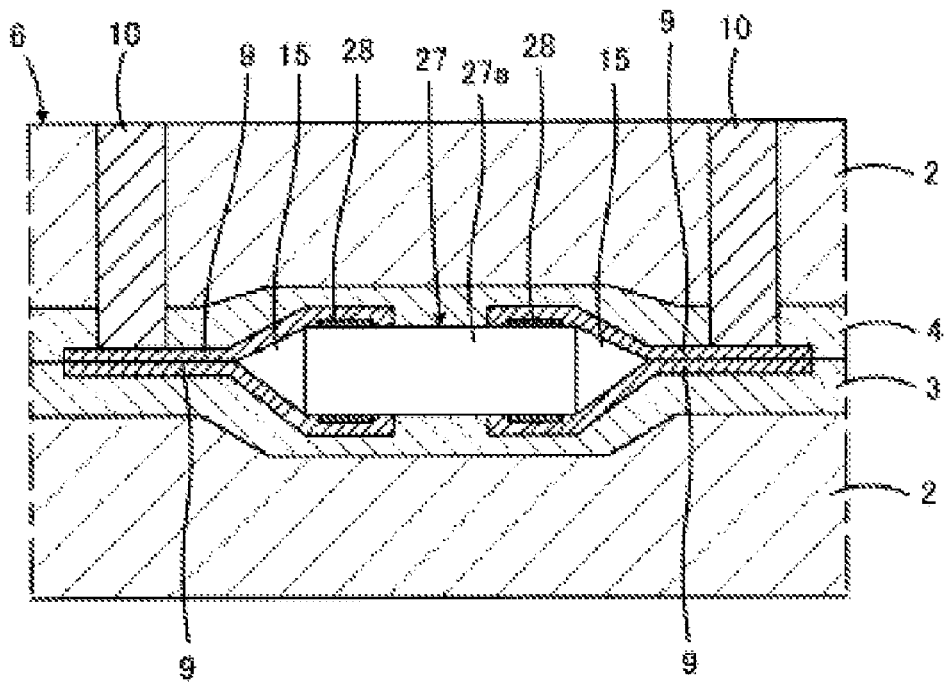
FIG. 10 is a view corresponding to FIG. 2, for illustrating a sixth preferred embodiment of the present invention.

FIG. 10 is a view corresponding to FIG. 2, for describing a sixth preferred embodiment of the present invention. In FIG. 10, a portion corresponding to a portion shown in FIG. 2 is denoted by a similar reference symbol, and duplicative description will not be repeated.

As shown in FIG. 10, also in the sixth preferred embodiment, as in the case of the second preferred embodiment, the internal conductive films 9 include portions arranged to sandwich an incorporated element 27 in the direction of lamination. One of the unique characteristics of the sixth preferred embodiment is that the incorporated element 27 includes an element main body 27a and terminal electrodes 28 disposed on outer surfaces of both ends of the element main body 27a, and the terminal electrodes 28 are disposed only on the upper and lower principal planes as depicted in the view of the element main body 27a. As in the case of the fifth preferred embodiment, one of the unique characteristics of the sixth preferred embodiment is also that the internal conductive films 9 each include a portion extending to cover the boundary between the element main body 27a of the incorporated element 27 and the terminal electrodes 28.

As for a mode of forming an unbaked internal conductive film for obtaining the internal conductive film 9 in such a state, it is substantially identical to the case of the fifth preferred embodiment. Also, according to the sixth preferred embodiment, a similar effect as that of the fifth preferred embodiment is exerted.

The configuration of covering the boundary between the element main body and the terminal electrode with the internal conductive film, as in the fifth and sixth preferred embodiments, can also be applied to a preferred embodiment in which the internal conductive film is formed on one side of the incorporated element as in the case of the first preferred embodiment.

In the foregoing, the present invention was described in association with the depicted preferred embodiments, however, other various modified examples are possible within the scope of the present invention.

For example, in the laminate 6 provided in the multilayer ceramic substrate 1 shown in FIG. 1, besides the interlayer constraining layers 3 and 4 provided between the base material layers 2 sandwiching the incorporated element 7, the interlayer constraining layer 5 situated in another interval between the base material layers 2 was preferably provided. Due to the presence of the latter interlayer constraining layer 5, the laminate 6 can be inhibited from shrinking more perfectly at the time of baking, however, if such an effect is not particularly desired, at least a portion of the interlayer constraining layer 5 may be omitted.

The raw laminate 6a shown in FIG. 3 was preferably overlaid with the outside constraining layers 19 and 20. According to these outside constraining layers 19 and 20, a more perfect shrinkage inhibiting effect is exerted at the time of baking, and dimensional accuracy of the obtained multilayer ceramic substrate 1 can be further improved. However, if such an effect is not particularly desired, at least one of the outside constraining layers 19 and 20 may not be provided.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic substrate comprising:
a laminate including a plurality of laminated base material layers and an interlayer constraining layer disposed between specific ones of the base material layers;
an incorporated element including first and second opposed main surfaces and being sandwiched between the specific ones of the base material layers; and
an internal conductive film electrically connected with the incorporated element and arranged inside of the laminate to extend in a direction of extension of the base material layers; wherein
the base material layers include a sintered body of a first powder including a glass material and a first ceramic material;
the interlayer constraining layer includes a second powder including a second ceramic material not sintered at a temperature for melting the glass material, and is in a state such that the second powder adheres together by diffusion or flow of a portion of the first powder including the glass material included in the base material layers into the interlayer constraining layer upon baking; and
the interlayer constraining layer includes an interlayer constraining layer arranged between the base material layers sandwiching the incorporated element so as to cover both of the first and second main surfaces of the incorporated element.

2. The multilayer ceramic substrate according to claim 1, wherein the incorporated element includes an element main body and a terminal electrode located on an outer surface of the element main body, and the internal conductive film includes a portion extending to cover a boundary between the element main body and the terminal electrode.

3. The multilayer ceramic substrate according to claim 1, wherein the internal conductive film includes a portion arranged to sandwich the incorporated element in a direction of lamination.

4. The multilayer ceramic substrate according to claim 1, further comprising a via conductor to be electrically connected with the incorporated element inside the laminate, wherein the via conductor is arranged to be connected with a portion of the internal conductive film drawn out to a lateral side of the incorporated element, the internal conductive film is electrically connected with the incorporated element.

5. The multilayer ceramic substrate according to claim 1, wherein the interlayer constraining layer provided between the base material layers sandwiching the incorporated element is arranged over an entire area in a direction of a principal plane of the laminate.

6. The multilayer ceramic substrate according to claim 1, wherein the interlayer constraining layer provided between the base material layers sandwiching the incorporated element is located only near the incorporated element.

7. The multilayer ceramic substrate according to claim 1, wherein the interlayer constraining layer includes an interlayer constraining layer other than that provided between the base material layers sandwiching the incorporated element.

8. The multilayer ceramic substrate according to claim 1, wherein the incorporated element is a chip component.

* * * * *